(12) United States Patent
Chen et al.

(10) Patent No.: US 6,616,855 B1
(45) Date of Patent: Sep. 9, 2003

(54) PROCESS TO REDUCE SURFACE ROUGHNESS OF LOW K DAMASCENE

(75) Inventors: Chao Cheng Chen, Matou (TW); Chen Nan Yeh, Hsi-Chih (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/963,594

(22) Filed: Sep. 27, 2001

(51) Int. Cl.7 .............................. B44C 1/22; H01L 21/00
(52) U.S. Cl. ........................... 216/38; 216/88; 438/692; 438/745
(58) Field of Search .............................. 216/38, 67, 88, 216/89, 91; 438/691, 692, 693, 723, 743, 745

(56) References Cited

U.S. PATENT DOCUMENTS

| 5,631,197 | A | 5/1997 | Yu et al. | 438/699 |
|---|---|---|---|---|
| 5,731,241 | A | 3/1998 | Jang et al. | 438/424 |
| 6,057,239 | A | 5/2000 | Wang et al. | 438/689 |
| 6,110,648 | A | 8/2000 | Jang | 430/312 |
| 6,184,128 | B1 | 2/2001 | Wang et al. | 438/637 |
| 6,211,061 | B1 | 4/2001 | Chen et al. | 438/622 |
| 6,235,628 | B1 | 5/2001 | Wang et al. | 438/638 |
| 6,242,356 | B1 * | 6/2001 | Jang et al. | 438/692 X |

* cited by examiner

*Primary Examiner*—William A. Powell
(74) *Attorney, Agent, or Firm*—George O. Saile; Stephen B. Ackerman

(57) ABSTRACT

Low K dielectrics, such as porous silica, present a problem during damascene processing in that the trench floor tends to be rough, thus requiring a thicker than desired barrier layer. This problem has been overcome by fully covering the trench floor with a layer of a flowable material following which an etchant is provided that etches both the trench and flowable materials at approximately the same rate. Using this etchant, the trench floor is then uniformly etched until only a small amount of flowable material remains. After removal of any and all remaining flowable material, it is found that the roughness at the trench floor has been reduced by a factor of about 3–5. This allows a barrier layer of normal thickness to be used during the standard copper damascene process without danger of copper leakage. The process is particularly well suited for use with porous silica dielectrics having a dielectric constant less than about 2.5.

19 Claims, 2 Drawing Sheets

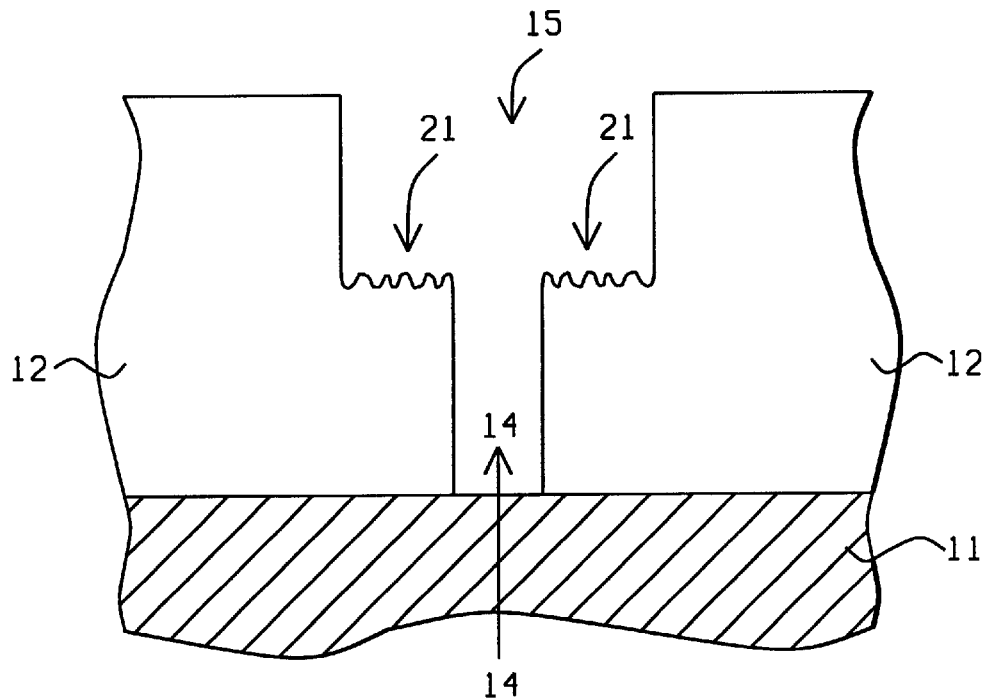
FIG. 1 – Prior Art
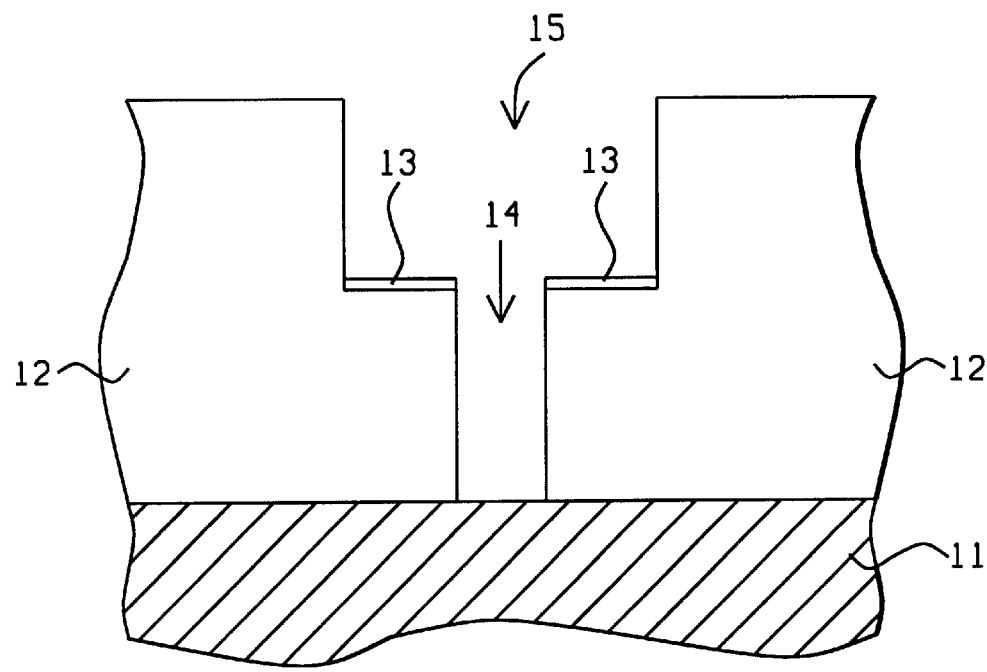
FIG. 2 – Prior Art

PROCESS TO REDUCE SURFACE ROUGHNESS OF LOW K DAMASCENE

FIELD OF THE INVENTION

The invention relates to the general field of damascene structures in micro-circuits with particular reference to their formation inside porous layers.

BACKGROUND OF THE INVENTION

The continued reduction in the dimensions of all parts of microcircuits includes the wiring channels and vias. Additionally, improvements in performance have been effected by the introduction of copper wiring and low K dielectrics. Among the most successful of the latter has been porous silica wherein the presence of uniformly distributed micro-bubbles allows the dielectric constant to be reduced to values as low as 2.5 or less. For the implementation of copper wiring, dual damascene structures have been widely adopted.

In FIG. 1 we show a schematic representation of a cross-section of a damascene structure. Dielectric layer 12 has been laid down over wiring level 11. Extending downwards from trench 15 (which will serve as a wiring channel at the next level) is via hole 14. When the structure has been filled with copper, via 14 provides a connection between the two wiring levels. Because of its high diffusivity and its proclivity for acting as a recombination center in silicon, steps must be taken to ensure that all the copper is confined to the damascene structure. This is routinely accomplished by the inclusion of a barrier layer (not shown) that lines the walls of the trench and the via hole.

As the porosity of porous silica is increased (with a corresponding decrease in the dielectric constant) there is a growing tendency for surfaces of porous silica that have been etched to exhibit significant roughness. Where the surface in question is the floor of a trench, (such as 15 in FIG. 1), the result is as marked schematically as surface 21 in FIG. 1. This, in turn, means that a much thicker barrier layer than normal is needed to be sure that there are no thin patches through which copper could move. In the absence of the afore-mentioned roughness problem, a barrier layer about 300 Angstroms thick is sufficient to contain the copper whereas, in the presence of a rough trench surface, this has to be increased to at least 500 Angstroms.

FIG. 2 illustrates one solution to this problem that has been used by the prior art. As part of the trench formation process, an etch stop layer 13 is included. This means that the degree of roughness on the trench's floor will be determined by the etch stop layer and not by the porous silica. Typically, layer 13 is about 300–500 Angstroms thick and, as already noted, the barrier layer is about 300 Angstroms thick. For a trench depth of about 0.3 microns, that leaves only about 2,200–2,400 Angstroms for copper which is less than would be preferred since the trench width is only about 1,600 Angstroms. Additionally, the thicker stop layer will increase the overall line-to-line capacitance.

Roughening of the trench and via sidewalls is not a problem because the sidewall is not directly bombarded by the etching species, so a preferred solution would be to find a way to reduce or eliminate the roughness at the trench floor, thereby allowing a thinner barrier layer to be used.

A routine search of the prior art was performed with the following references of interest being found:

In U.S. Pat. No. 6,235,628, Wang et al. disclose a dual damascene process with a middle etch stop layer. In U.S. Pat. No. 5,621,197, Yu shows a SOG sacrificial layer process. U.S. Pat. No. 6,211,0.61 (Chen et al.) reveals a dual damascene process with no middle etch stop layer while in U.S. Pat. No. 6,184,128, Wang also shows a dual damascene process. U.S. Pat. No. 6,110,648 (Jang), U.S. Pat. No. 5,731,241(Jang et al.), and U.S. Pat. No. 6,057,239 (Wang et al.) are all related dual damascene patents.

SUMMARY OF THE INVENTION

It has been an object of at least one embodiment of the present invention to provide a process for etching a trench in a layer.

Another object of at least one embodiment of the present invention has been that said process result in a trench whose floor has a lower roughness value than a similar trench produced using prior art processes.

Still another object of at least one embodiment of the present invention has been that said process be readily incorporable into processes for forming dual damascene structures.

A further object of at least one embodiment of the present invention has been that said process not require the presence of an etch stop layer during trench formation.

These objects have been achieved by fully covering the trench floor with a layer of a flowable material. Then an etchant is provided that etches both the trench and flowable materials at approximately the same rate, Using this etchant, the trench floor is then uniformly etched until only a small amount of flowable material remains. After any and all remaining flowable material has been removed, it is found that the roughness at the trench floor has been reduced by a factor of about 3–5. This allows a barrier layer of normal thickness to be used during the standard copper damascene process without danger of copper leakage. The process is particularly well suited for use with porous silica dielectrics having a dielectric constant less than about 2.5.

BRIEF DESCRIPTION OF THE DRAWINGS

FIG. 1 shows how the floor of a trench in a porous material ends up with a rough surface.

FIG. 2 shows a prior art solution to the problem highlighted in FIG. 1.

DESCRIPTION OF THE PREFERRED EMBODIMENTS

We will describe the process of the present invention by using formation of a damascene structure (in particular the trench), embedded in a porous medium, as an example. However, it should be understood that the process is more general than this and could be applied to the smoothing out of any rough surface, regardless of the origin of said roughness.

Figure 3:
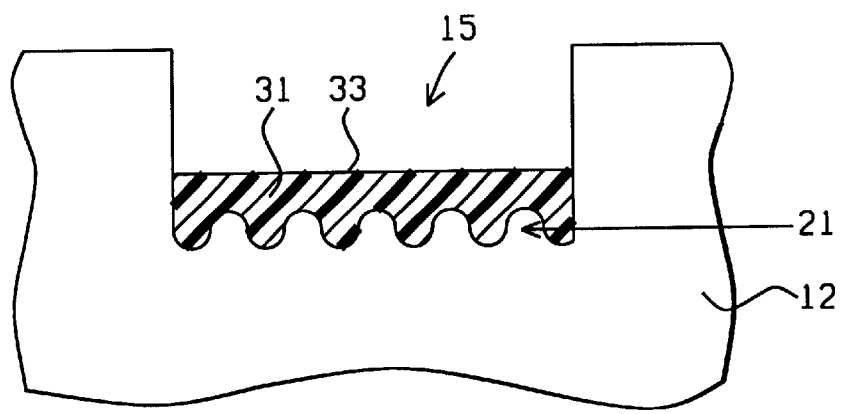
FIGS. 3 and 4 show the process steps introduced by the present invention in order to solve the roughening problem without having to add an etch stop layer.

We begin our description by referring to FIG. 3. which shows trench 15 after its a formation within porous layer 12 by means of etching through a suitable mask (not shown). Although the invention is not limited thereto, said porous layer will usually be porous silica that has a dielectric constant less than about 2.5.

Generally, the trench had a depth between about 0.25 and 0.35 microns. As in FIG. 1, the floor 21 of trench 15 is rough, typically having a roughness value between about 300 and 600 Angstroms. After the trench, including the floor, has been cleaned by etching at a pressure of between about 50 and 150 mtorr in $CF_4$ (20–60 SCCM), $O_2$ (10–30 SCCM), and Ar (200–500 SCCM) at a power level between about 400–800 W, there follows a key feature of the invention which is the deposition onto trench floor 21 of layer 31 of a flowable material in quantities sufficient to ensure that the trench floor is fully covered.

To ensure good leveling of the flowable material it may be temporarily heated, to reduce its viscosity, and then allowed to return to room temperature prior to the next step. Alternately, the flowable material may be in the form of a solution, colloid, or suspension so that it forms a level surface as soon as it is applied, but, after application, will need to be heated to expel liquid and cause it to harden. Examples of the flowable material include, but are not limited to, organic bottom ant-reflection coatings (BARCs), organic resins, and organic resists.

Figure 4:
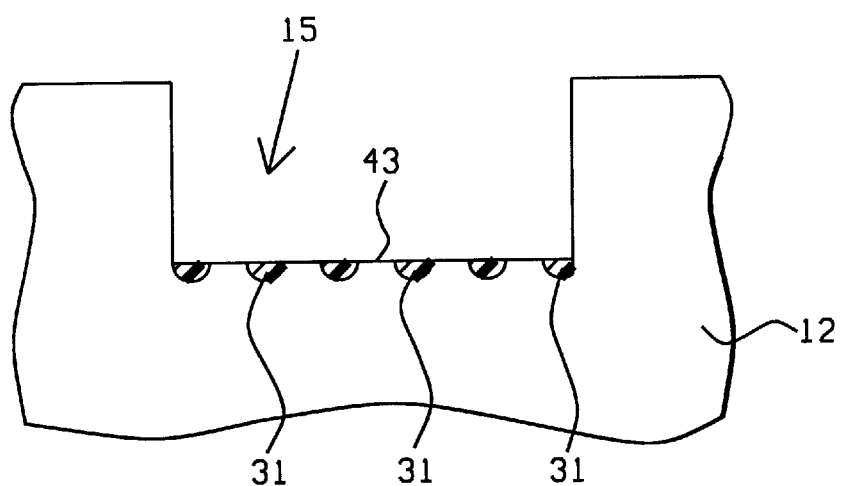

An important feature of the present invention is that an etchant is selected for use in the next step, said etchant being such that it etches the porous material at a rate that is at least about 0.5 times the rate that it etches the flowable material and no more than about 2 times the rate that it etches the flowable material. Then, using said etchant, etching of the porous and flowable materials is allowed to proceed until the roughness value of the trench floor has been reduced to less than about 200 Angstroms. This has been schematically illustrated in FIG. 4. Our preferred process for etching the porous and flowable materials has been at a pressure of about 50 mtorr in $CF_4$ (about 20 SCCM), $O_2$ (about 10 SCCM), and Ar (about 100 SCCM) at a power level of about 300 W, but any process that meets the restrictions specified above could have been used.

Figure 5:
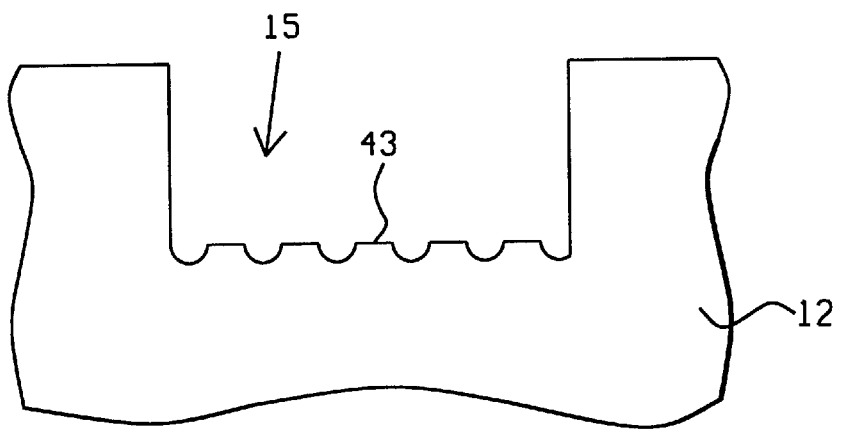
FIG. 5 illustrates the trench floor after application of the process of the present invention.

Once this has been accomplished, any and all remaining flowable material is selectively removed by etching at a pressure of about 40 mtorr in $N_2$ (about 40 SCCM) and $O_2$ (about 40 SCCM), and Ar (about 100 SCCM) at a power level of about 300 W, giving the structure the appearance shown in FIG. 5.

The remaining steps used to complete the damascene structure are conventional to the art. First, a via hole that extends downwards from the trench floor is formed (see 14 in FIG. 1). Then the trench floor as well as its and the via hole'sidewalls are lined with a barrier layer (not shown). Because of the reduced roughness of the trench floor, a barrier layer of normal thickness (i.e. no more than about 300 Angstroms thick) may safely be used. Finally, the via hole and the trench are filled with metal, typically copper, which is fully and permanently contained by the barrier layer, despite the lower thickness of the latter.

What is claimed is:

1. A process for smoothing a first surface having a first roughness value, comprising:

depositing on said first surface a layer of flowable material, having a second surface, to a thickness sufficient for said first surface to be entirely below said second surface;

providing an etchant that etches the first surface at a first rate and the second surface at a second rate, the ratio of said first etch rate to said second etch rate being greater than about 0.5 and less than about 2;

using said etchant, etching said surfaces until said first roughness value has been reduced to a second roughness value; and then selectively removing all remaining flowable material.

2. The process described in claim 1 wherein the flowable material is selected from the group consisting of BARCs, resins, and organic resists.

3. The process described in claim 1 wherein said flowable material is heated to reduce its viscosity and then allowed to cool prior to said etching step.

4. The process described in claim 1 wherein said flowable material is heated after being deposited on said first surface and prior to said etching step.

5. The process described in claim 1 wherein said etching step further comprises etching at a pressure of about 50 mtorr in $CF_4$ (about 20 SCCM), $O_2$ (about 10 SCCM), and Ar (about 100 SCCM) at a power level of about 300 W.

6. The process described in claim 1 wherein said first roughness value is between about 300 and 600 Angstroms.

7. The process described in claim 1 wherein said second roughness value is less than about 200 Angstroms.

8. The process described in claim 1 wherein said step of selectively removing all remaining flowable material further comprises etching at a pressure of about 40 mtorr in $N_2$ (about 40 SCCM) and $O_2$ (about 40 SCCM), and Ar (about 100 SCCM) at a power level of about 300 W.

9. A process for etching a trench in a layer of porous material, comprising:

on said layer of porous material, forming a mask to define said trench;

using said mask, etching the porous layer to form the trench, said trench having a floor that has a first roughness value;

then cleaning said trench;

depositing on said trench floor a layer of flowable material, that fully covers the trench floor;

providing an etchant that etches the porous material at a first rate and the flowable material at a second rate, the ratio of said first etch rate to said second etch rate being greater than about 0.5 and less than about 2;

using said etchant, etching said porous material and said flowable material until said first roughness value has been reduced to a second roughness value; and then selectively removing all remaining flowable material.

10. The process described in claim 9 further comprising etching a via hole that extends downwards from said trench floor, lining the trench and the via hole with a barrier layer, and then filling the via hole and the trench with metal, thereby forming a dual damascene structure.

11. The process described in claim 10 wherein said porous layer has a dielectric constant less than about 2.5 and said barrier layer is no more than about 300 Angstroms thick.

12. The process described in claim 9 wherein said porous material is porous silica having a dielectric constant that is less than about 2.5.

13. The process described in claim 9 wherein said trench has a depth between about 0.25 and 0.35 microns.

14. The process described in claim 9 wherein the flowable material is selected from the group consisting of BARCs, resins, and organic resists.

15. The process described in claim 9 wherein said etching step further comprises etching at a pressure of about 50 mtorr in $CF_4$ (about 20 SCCM), $O_2$ (about 10 SCCM), and Ar (about 100 SCCM) at a power level of about 300 W.

16. The process described in claim 9 wherein said first roughness value is between about 300 and 600 Angstroms.

17. The process described in claim 9 wherein said second roughness value is less than about 200 Angstroms.

18. The process described in claim 9 wherein said step of selectively removing all remaining flowable material further comprises etching at a pressure of about 40 mtorr in $N_2$ (about 40 SCCM), $O_2$ (about 40 SCCM), and Ar (about 100 SCCM) at a power level of about 300 W.

19. The process described in claim 9 wherein said step of cleaning the trench further comprises etching at a pressure of about 40 mtorr in $N_2$ (about 40 SCCM) and $O_2$ (about 40 SCCM), and Ar (about 100 SCCM) at a power level of about 300 W.

* * * * *